United States Patent
Holighaus et al.

(10) Patent No.: US 6,523,602 B2
(45) Date of Patent: Feb. 25, 2003

(54) SWITCHGEAR CABINET WITH AN AIR-CONDITIONING DEVICE

(75) Inventors: Heiko Holighaus, Eschenburg (DE); Walter Nicolai, Buseck 1 (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 09/991,383

(22) Filed: Nov. 13, 2001

(65) Prior Publication Data

US 2002/0088604 A1 Jul. 11, 2002

(30) Foreign Application Priority Data

Nov. 11, 2000 (DE) .......................................... 100 55 972

(51) Int. Cl.[7] .............................................. F28D 15/00
(52) U.S. Cl. .................................... 165/45; 165/104.34
(58) Field of Search ............................. 165/45, 104.33, 165/104.34, 119

(56) References Cited

U.S. PATENT DOCUMENTS

| | | | | |
|---|---|---|---|---|
| 508,654 A | * | 11/1893 | Thomson ..................... | 165/45 |
| 3,212,563 A | * | 10/1965 | Schrader ..................... | 165/108 |
| 3,452,813 A | * | 7/1969 | Watkins ..................... | 165/120 |
| 3,559,728 A | * | 2/1971 | Lyman et al. ................ | 165/122 |
| 5,216,577 A | * | 6/1993 | Schilling ..................... | 165/45 |
| 5,477,914 A | * | 12/1995 | Rawlings ..................... | 165/45 |
| 6,076,595 A | * | 6/2000 | Austin et al. .......... | 165/104.26 |
| 6,247,526 B1 | * | 6/2001 | Okamoto et al. ....... | 165/104.34 |

FOREIGN PATENT DOCUMENTS

| | | |
|---|---|---|
| DE | 41 07 229 | 3/1991 |
| DE | 196 09 794 | 3/1996 |
| DE | 197 12 474 | 3/1997 |

* cited by examiner

Primary Examiner—Allen Flanigan
(74) Attorney, Agent, or Firm—Pauley Petersen Kinne & Erickson

(57) ABSTRACT

A switchgear cabinet with an air-conditioning device having a heat exchanger, wherein the air in the interior of the switchgear cabinet can be or is conducted to the heat exchanger and can be conditioned by the heat exchanger. Effective air-conditioning of the interior of the switchgear cabinet, along with simultaneously reduced energy requirements, is possible if the heat exchanger is embodied as an underground heat exchanger and is placed into the ground.

16 Claims, 1 Drawing Sheet

SWITCHGEAR CABINET WITH AN AIR-CONDITIONING DEVICE

BACKGROUND OF THE INVENTION

1. Field of the Invention

This invention relates to a switchgear cabinet with an air-conditioning device having a heat exchanger, wherein air in the interior of the switchgear cabinet can be or is conducted to the heat exchanger and can be conditioned by the heat exchanger.

2. Description of Related Art

Switchgear cabinets of this type are known in many variations. Separate air-conditioners are installed on an outside of the switchgear cabinet for air-conditioning the interior of the switchgear cabinet are shown, for example, in German Patent Reference DE 197 12 474 C1 or German Patent Reference DE 196 09 794 C1. Air-conditioners which can mounted on the top are known from German Patent Reference DE 41 07 229 C2.

Customarily, the known air-conditioners have a coolant circuit, so that sufficient amounts of waste heat can be removed from the interior of the switchgear cabinet. Air-conditioners of this type have a relatively large energy consumption. If switchgear cabinets are placed in outside areas, batteries are often required for supplying current because of the lack of electrical connections, which must be maintained at regular intervals and possibly recharged.

SUMMARY OF THE INVENTION

It is one object of this invention to provide a switchgear cabinet of the type mentioned above but with efficient air-conditioning of the switchgear cabinet and with relatively little energy requirements.

In accordance with the invention this object is achieved with a heat exchanger that has an underground heat exchanger, which is placed into the ground.

In connection with the underground heat exchanger, use is made of a relatively constant temperature level (6° C. to 11° C.) which prevails in the ground, starting at a depth of approximately 1 m. Because the ground has a large storage capacity, particularly if it is moist, this heat storage can be effectively used for cooling the switchgear cabinet. Therefore, during summer operations of the switchgear cabinet and with permissible internal temperatures of, for example, 45° C., there is an approximate temperature difference of 34° Kelvin available to the underground heat exchanger. It is easily possible to achieve a high cooling output with this arrangement. In winter, when the temperature conditions are reversed, it is possible with a permissible internal temperature of 0° C. to utilize a temperature difference of, for example, 6° Kelvin for the underground heat exchanger. In this mode the underground heat exchanger operates as a heater.

The air contained in the interior of the switchgear cabinet can be conveyed by the underground heat exchanger. However, it is also possible to conduct various fluids through the underground heat exchanger. Accordingly, particular gases or liquids can be conveyed. An interior heat exchanger is assigned to the interior of the switchgear cabinet, particularly if gases or liquids are used. The fluid coming from the underground heat exchanger then circulates through this interior heat exchanger. For improving its efficiency, it is then possible to assign a fan to the heat exchanger.

In one embodiment which is particularly simple, the underground heat exchanger is connected to an inlet line and to an outlet line, wherein air coming from the interior of the switchgear cabinet can be supplied to the underground heat exchanger via the inlet line and wherein this air, which has been conditioned in the underground heat exchanger, can be returned, at least in part, to the interior of the switchgear cabinet through the outlet line after it has flowed through the underground heat exchanger. Because the supply of air from the switchgear cabinet is directly conveyed through the underground heat exchanger, only a few structural components are required.

In accordance with one preferred embodiment of this invention, the underground heat exchanger is embodied as a flexible plastic pipe. This entire plastic pipe can be placed into the ground in a simple and time-saving manner. It is thus possible to provide the outlet line and the inlet line connected in one piece with the underground heat exchanger and conducted as far as the area of the interior of the switchgear cabinet. This outlet line and the inlet line are connected to pipe connector elements leading into the interior of the switchgear cabinet. Because the outlet and the inlet lines are embodied as one piece with the underground heat exchanger, no additional assembly and parts outlay is required. It is possible to conduct the plastic pipe as far as the area of the interior of the switchgear cabinet, or it can be connected with appropriate pipe connectors.

In accordance with one embodiment of this invention, the underground heat exchanger is assembled from rigid pipe sections and pipe elbows. For example, pipe elements which are customary in plumbing technology can be used as rigid pipe sections and pipe elbows. They have a sufficient pressure resistance. Moreover, sufficient heat transfer can be assured at the pipe walls.

An effective heat exchange in the interior of the switchgear cabinet is possible if the outlet line forms a blow-in or aspirating opening in the roof area of the interior of the switchgear cabinet, and the inlet line conveys the conditioned air into the bottom area of the interior of the switchgear cabinet.

In accordance with one embodiment of this invention, at least one fan is assigned to the inlet line and/or the outlet line. The use of one or several fans makes a less noisy operation of the air-conditioner possible. This is possible if the interior of the switchgear cabinet is surrounded by a switchgear cabinet body, and each fan is housed in the interior of the switchgear cabinet. In this case no noise-generating elements of the air-conditioner are present outside the switchgear cabinet, such as is normally required with air-conditioners. The fans require relatively little electrical energy. In particular, the fans can be designed as direct current fans, which are directly supplied by a battery assigned to the interior of the switchgear cabinet.

Preferably, the underground heat exchanger is placed in a meander shape in the ground. Here, spaces are created between the individual loops formed by the meanders. In this case the loops must be spaced apart sufficiently far so that no mutual heat interference can occur.

In a switchgear cabinet in accordance with this invention, a switchgear cabinet body is fastened on a switchgear cabinet base and the cabinet body encloses the interior of the switchgear cabinet. The bottom group forms a seal between the base supporting the switchgear cabinet, for example a concrete base, and the actual switchgear cabinet body.

With this, depending on the design of the seal of the bottom group, moisture can be prevented from entering the interior of the switchgear cabinet. In some applications, the seal prevents rodents, for example, from entering the interior of the switchgear cabinet.

In accordance with this invention, the inlet lines and the outlet lines are closed off at the switchgear cabinet by air-permeable covers. This prevents objects, for example tools, from falling into the underground heat exchanger during assembly in the interior of the switchgear cabinet. This also prevents rodents, which can enter the pipe area of the underground heat exchanger, from also entering the interior of the switchgear cabinet.

BRIEF DESCRIPTION OF THE DRAWING

This invention is explained in greater detail in view of an exemplary embodiment shown in the drawings, wherein.

DESCRIPTION OF PREFERRED EMBODIMENTS

Figure 1:
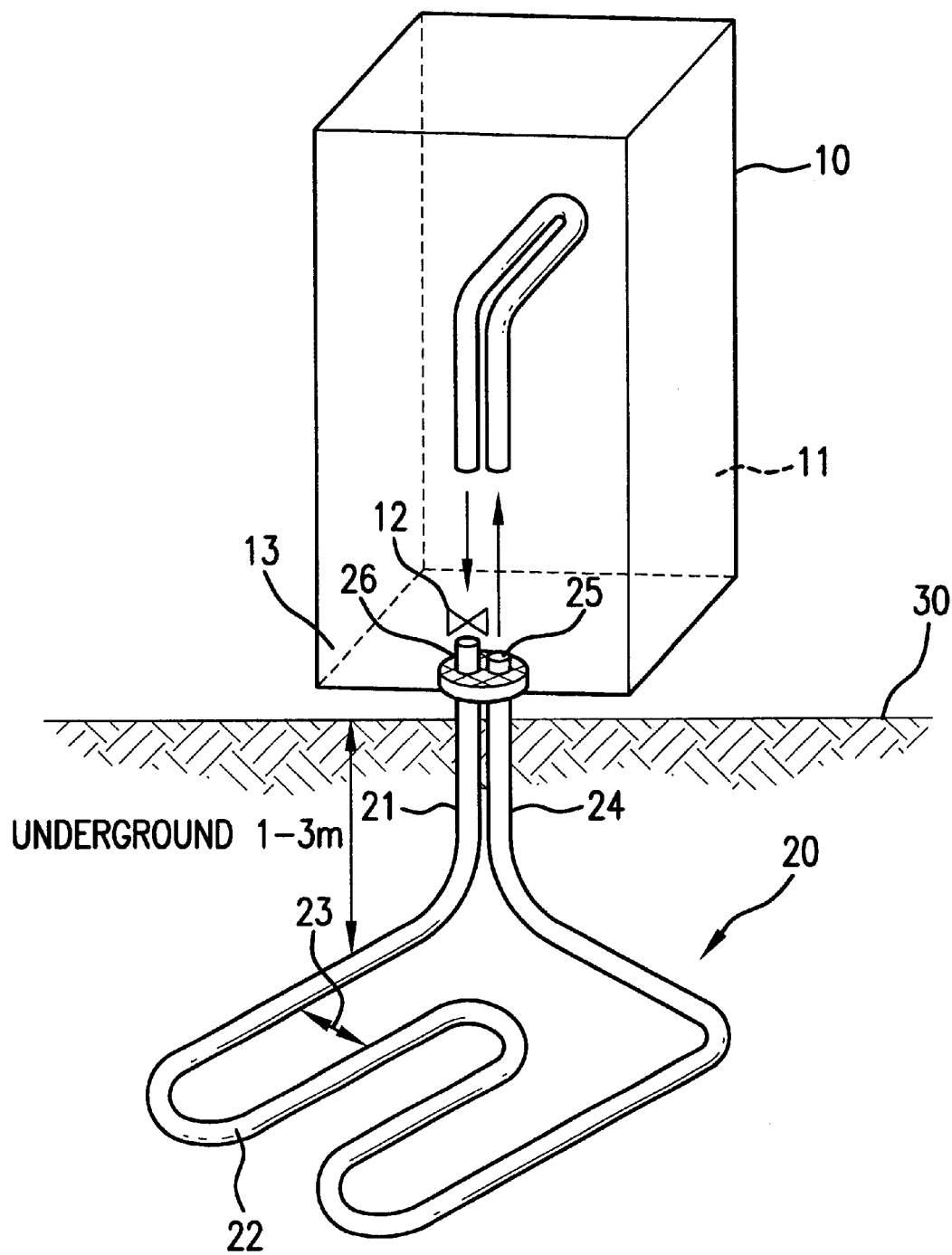
FIG. 1 is a perspective view of a switchgear cabinet and the attached underground heat exchanger.

As shown in the drawing, a switchgear cabinet 10 is placed above ground level 30. The switchgear cabinet 10 has a switchgear cabinet base 13 which is fixed in place on a concrete seal set in the ground. The outlet line 21 and the inlet line 24 of an underground heat exchanger 20 project out of the concrete seal. The outlet line 21 forms the aspirating opening 26, and the inlet line 24 forms the exhaust opening 25. A fan 12 is assigned to the aspirating opening 26. The fan 12 has a direct current motor, which is operated by a battery maintained in the interior 11 of the switchgear cabinet. As shown in the drawing, the fan 12 is also arranged in the interior of the switchgear cabinet. Thus it does not transmit any, or only negligible, noise emissions to the outside. The underground heat exchanger 20 is embodied as a flexible plastic pipe, which is placed into the ground in a meander shape. In the present case, the depth of placement is selected to be between one and three meters. The meanders are formed by several loops 22, wherein the loops 22 are placed apart from each other by spaces 23. The spaces 23 assure that no, or only negligible, heat interferences occurs between the individual loops. The plastic pipe of the underground heat exchanger also includes the inlet line 24 and the outlet line 21.

When operating the heat exchanger, air is aspirated from the interior of the switchgear cabinet via the fan 12 and is conveyed to the underground heat exchanger via the outlet line 21. During the passage through the individual loops 22 of the underground heat exchanger 20, the heat energy conveyed by the air flow is continuously transmitted to the surrounding ground. The air thus cooled is conveyed back into the interior of the switchgear cabinet via the inlet line 24.

During winter operations the energy supply to the underground heat exchanger 20 is reversed. Then heat energy from the ground is transferred to the conveyed air flow and can be released into the interior of the switchgear cabinet.

What is claimed is:

1. In a switchgear cabinet having an air-conditioning device with a heat exchanger, wherein air in an interior of the switchgear cabinet is conducted to and can be conditioned by the heat exchanger, the improvement comprising: the heat exchanger having an underground heat exchanger (20) positioned into the ground, the heat exchanger having an interior heat exchanger assigned to an interior of the switchgear cabinet and the underground heat exchanger (20) forming a closed circuit system in which a fluid circulates, the underground heat exchanger (20) connected to an inlet line (24) and to an outlet line (21), wherein the air coming from the interior of the switchgear cabinet is supplied to the underground heat exchanger (20) through the inlet line (24) and is conditioned in the underground heat exchanger (20) and at least a portion of the conditioned air is returned to the interior of the switchgear cabinet through the outlet line (21) after flowing through the underground heat exchanger (20), and the inlet line (24) and the outlet line (21) closed off at the switchgear cabinet by air-permeable covers.

2. In the switchgear cabinet in accordance with claim 1, wherein the underground heat exchanger (20) is a flexible plastic pipe.

3. In the switchgear cabinet in accordance with claim 2, wherein one of:
   the outlet line (21) and the inlet line (24) are connected in one piece with the underground heat exchanger (20) and are conducted as far as an area of the interior (11) of the switchgear cabinet; and
   the outlet line (21) and the inlet line (24) are connected to pipe connector elements leading into the interior (11) of the switchgear cabinet.

4. In the switchgear cabinet in accordance with claim 1, wherein the underground heat exchanger (20) is assembled from rigid pipe sections and pipe elbows.

5. In the switchgear cabinet in accordance with claim 4, wherein the outlet line (21) forms one of a blow-in and an aspirating opening (26), and the inlet line (24) conveys the conditioned air into a bottom area of the interior (11) of the switchgear cabinet.

6. In the switchgear cabinet in accordance with claim 5, wherein at least one fan (12) is assigned to at least one of the inlet line (24) and the outlet line (21).

7. In the switchgear cabinet in accordance with claim 6, wherein the interior (11) of the switchgear cabinet is surrounded by a switchgear cabinet body, and at least one fan (12) is housed in the interior (11) of the switchgear cabinet.

8. In the switchgear cabinet in accordance with claim 7, wherein the underground heat exchanger (20) is in a meander shape in the ground.

9. In the switchgear cabinet in accordance with claim 8, wherein a cabinet body is fastened on a switchgear cabinet base (13), the cabinet body encloses the interior (11) of the switchgear cabinet, and the switchgear cabinet base (13) has a bottom in which the inlet line (24) and the outlet line (21) are maintained and are sealably conducted into the interior (11) of the switchgear cabinet.

10. In the switchgear cabinet in accordance with claim 1, wherein the underground heat exchanger (20) is a flexible plastic pipe.

11. In the switchgear cabinet in accordance with claim 10, wherein one of:
   an outlet line (21) and an inlet line (24) are connected in one piece with the underground heat exchanger (20) and are conducted as far as an area of the interior (11) of the switchgear cabinet; and
   the outlet line (21) and the inlet line (24) are connected to pipe connector elements leading into the interior (11) of the switchgear cabinet. (21).

12. In the switchgear cabinet in accordance with claim 1, wherein the outlet line (21) forms one of a blow-in and an aspirating opening (26), and the inlet line (24) conveys the conditioned air into a bottom area of the interior (11) of the switchgear cabinet.

13. In the switchgear cabinet in accordance with claim 1, wherein at least one fan (12) is assigned to at least one of the inlet line (24) and the outlet line (21).

14. In the switchgear cabinet in accordance with claim 13, wherein the interior (11) of the switchgear cabinet is surrounded by a switchgear cabinet body, and at least one fan (12) is housed in the interior (11) of the switchgear cabinet.

15. In the switchgear cabinet in accordance with claim 1, wherein the underground heat exchanger (20) is in a meander shape in the ground.

16. In the switchgear cabinet in accordance with claim 1, wherein a cabinet body is fastened on a switchgear cabinet base (13), the cabinet body encloses the interior (11) of the switchgear cabinet, and the switchgear cabinet base (13) has a bottom in which the inlet line (24) and the outlet line (21) are maintained and are sealably conducted into the interior (11) of the switchgear cabinet.

* * * * *